(12) United States Patent
Skeete

(10) Patent No.: US 7,727,805 B2
(45) Date of Patent: Jun. 1, 2010

(54) REDUCING STRESS IN A FLIP CHIP ASSEMBLY

(75) Inventor: Oswald Skeete, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 11/811,489

(22) Filed: Jun. 11, 2007

(65) Prior Publication Data

US 2008/0305581 A1    Dec. 11, 2008

(51) Int. Cl.
*H01L 21/00* (2006.01)
(52) U.S. Cl. ................... 438/108; 257/E23.021
(58) Field of Classification Search .......... 257/779; 438/108
See application file for complete search history.

(56) References Cited

U.S. PATENT DOCUMENTS

| | | | |
|---|---|---|---|
| 5,874,043 A * | 2/1999 | Sarkhel et al. | 420/557 |
| 6,548,898 B2 * | 4/2003 | Matsuki et al. | 257/746 |
| 6,879,041 B2 * | 4/2005 | Yamamoto et al. | 257/737 |
| 7,332,821 B2 * | 2/2008 | Bernier et al. | 257/780 |
| 7,547,577 B2 * | 6/2009 | Card et al. | 438/108 |
| 2002/0089067 A1 * | 7/2002 | Crane et al. | 257/778 |

OTHER PUBLICATIONS

U.S. Appl. No. 11/617,819, filed Dec. 29, 2006, entitled "Flux Overspray Reduction Apparatus, Systems, And Methods," by James Patrick Mellody, et al.

\* cited by examiner

*Primary Examiner*—David A Zarneke
*Assistant Examiner*—Jenny L Wagner
(74) *Attorney, Agent, or Firm*—Trop, Pruner & Hu, P.C.

(57) ABSTRACT

In one embodiment, the present invention includes a method for depositing lead-free bumps on a package substrate, depositing an alloy material on the lead-free bumps, attaching a semiconductor die including conductive bumps to the package substrate so that the conductive bumps contact the alloy material, and heating attached components to reflow the alloy material to form a joint therebetween. Other embodiments are described and claimed.

14 Claims, 4 Drawing Sheets

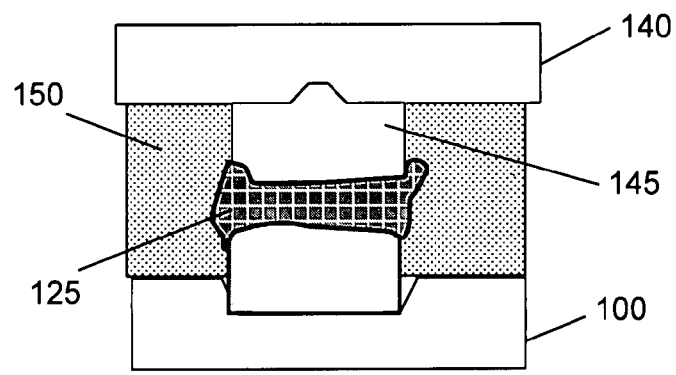
FIG. 3A
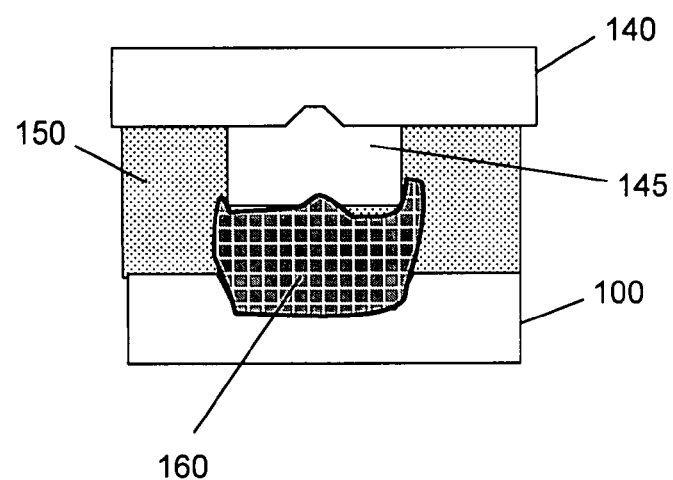
FIG. 3B
FIG. 3

REDUCING STRESS IN A FLIP CHIP ASSEMBLY

BACKGROUND

Many of today's semiconductor packages are formed using so-called flip-chip technology. In such packaging, a semiconductor die is coupled to an underlying package substrate using a solder to connect a bump on the die with a bump on the package substrate.

As process technologies move away from lead-based solders to lead-free solders, after elevated temperatures at which reflow is performed, sufficient stress can be present in the package to cause delamination of dielectric layers such as a carbon doped oxide (CDO) layer of the semiconductor die. Such stress can occur as a result of coefficient terminal expansion (CTE) mismatches. While one solution to this problem implements a so-called no-flow under film (NUF) process, where an underflow material is allowed to gel and distribute stress to an entire die surface before cooling of the resulting joined package and die to room temperature, excessive costs and time is required and furthermore, expensive tooling is needed for each such die size to enable this process.

BRIEF DESCRIPTION OF THE DRAWINGS

FIGS. 3A-3B are cross-section views of further process steps in accordance with an embodiment of the present invention.

DETAILED DESCRIPTION

In various embodiments, a flip chip package may be formed using lead-free materials for chip attach, while avoiding delamination such as CDO delamination. To enable such a package, a low melting point alloy may be applied to metal bumps on a die or corresponding substrate. A chip attach process may then be performed at a low temperature to reflow the alloy, soldering the die to the substrate. The stress due to CTE mismatch between die and substrate may be reduced due to a relatively small delta in temperature between reflow process and ambient temperature.

After such reflow, an epoxy underfill material may be applied using, for example, a capillary underfill process. This underfill material may then be gelled below a melting point of the solder to contain the solder after final cure. After the gel process is completed, the final cure temperature may be applied to thus redistribute package stress across die and bumps after cure, reducing stress on the individual bumps. After the cure process, the package temperature may be raised above the point of the solder bumps on the substrate, causing melting and dissolution of the material. The final composition of the joint may be in proportion to the percentage of materials within the joint materials. In various embodiments, the proportions of these materials may be chosen to have a resulting alloy with a high melting point (e.g., greater than approximately 200 degrees Celsius (C)) and mechanical properties to enable high reliability under stress conditions.

Figure 1A:
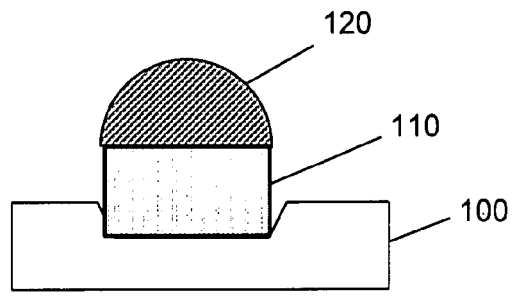
FIGS. 1A-1D are cross-sectional views of process steps in accordance with an embodiment of the present invention.

Referring now to FIGS. 1A-1D, shown are cross-sectional views of process steps in accordance with an embodiment of the present invention. As shown in FIG. 1A, a chip attach process may begin by receiving an incoming substrate, i.e., a package substrate 100 including a metal bump 110 which, in some embodiments, may be a tin silver copper (SnAgCu) bump, above which an alloy material 120, which in one embodiment may be indium tin (InSn) may be located. In one embodiment, metal bump 110 may be a lead-free solder bump, e.g., 95.5 Sn/3.8 Ag/0.7 Cu or another such material. To form metal bumps 110 on substrate 100, a lead-free solder paste may be applied to substrate 100 and reflowed to form the primary bumps, which may then be flattened to form a flat surface to support an additional layer of alloy 120. In one embodiment, alloy 120 may be a low melting point alloy having good wetting characteristics, e.g., indium tin (InSn), such as a composition having 52 In/48 Sn, 118 degrees C. eutectic or equivalent. While shown as being applied to metal bump 110 on substrate 100, in other implementations the alloy material may be adapted to a metal bump on a die.

Figure 1B:
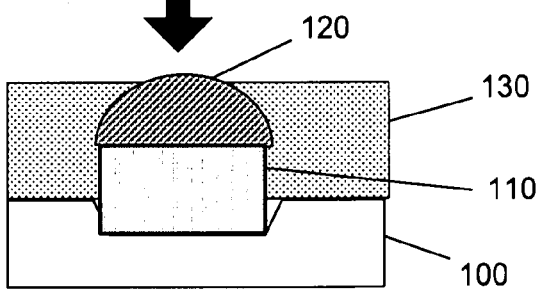
Figure 1C:
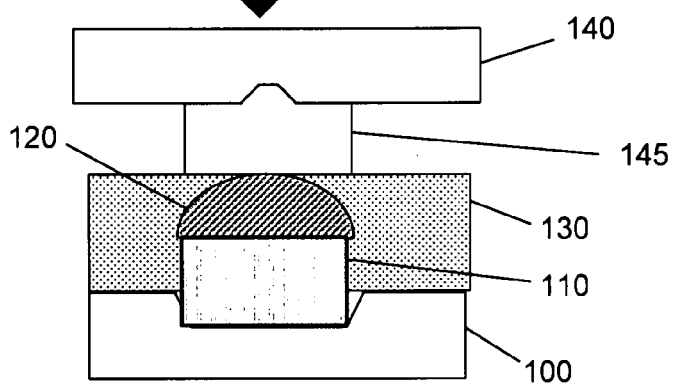
Figure 1D:
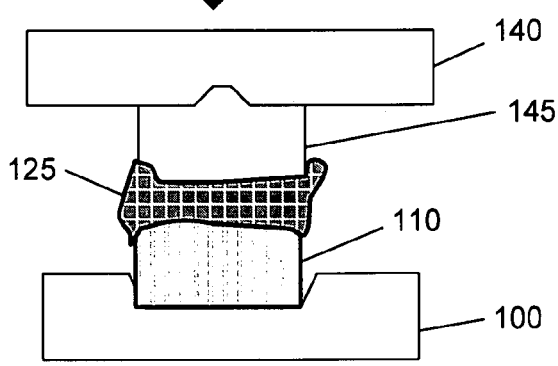

Referring now to FIG. 1B, then a flux material 130 may be dispensed. After flux 130 is dispensed, a chip attach process may be performed as shown in FIG. 1C, in which a die 140 having a metal bump 145 such as a copper bump may be located above alloy material 120. Note that die 140 may include dielectric layers that may be formed of a CDO, which could suffer from delamination, depending on chip attach process used. Embodiments may avoid such delamination.

After fluxing, a chip alignment and placement process may thus be performed. The resulting chip/substrate assembly may be placed in a reflow furnace with a temperature profile such as that shown in FIG. 2. Alloy 120 may thus become a liquid, forming the joint between die 140 and substrate 100. The chip joint may be formed by reflowing alloy 120, soldering die 140 to substrate 100. In this process, the stress due to CTE mismatch between die 140 and substrate 100 may be reduced because of a relatively small delta between reflow temperature and ambient temperature.

Figure 2:
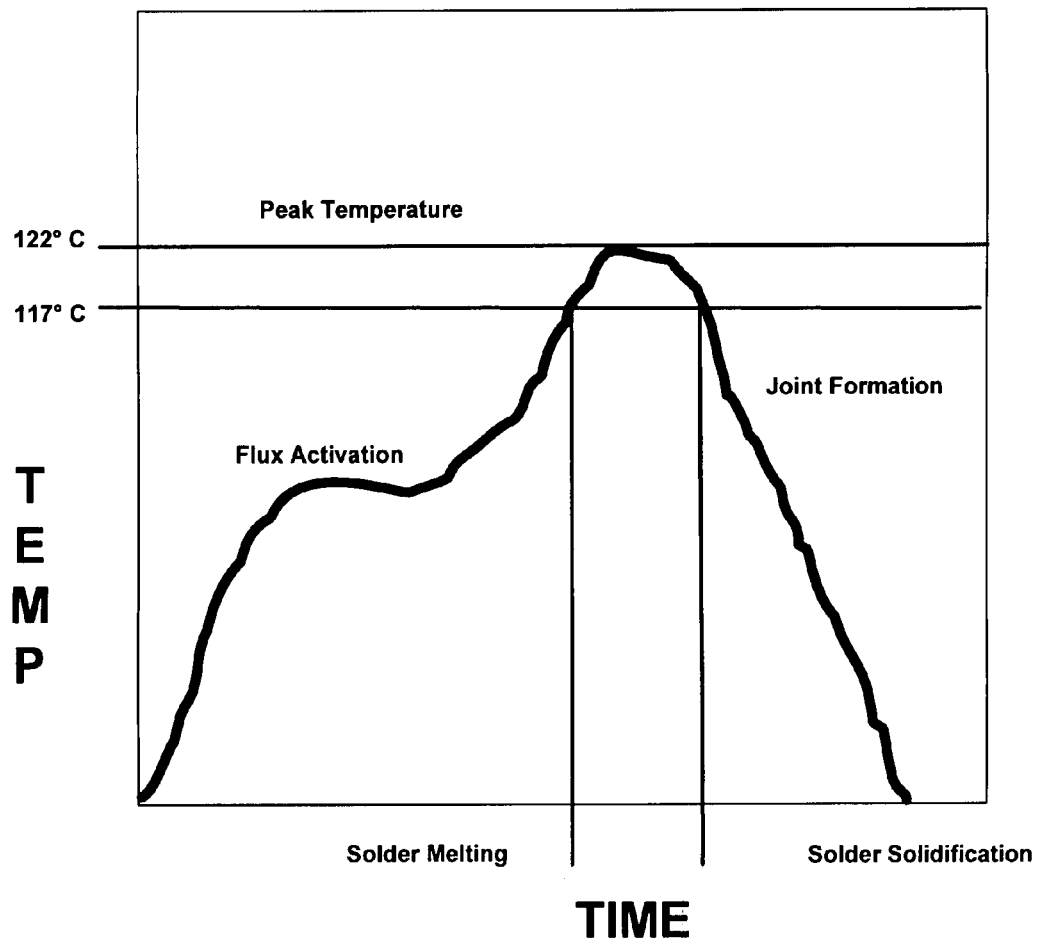
FIG. 2 is a solder reflow profile in accordance with one embodiment of the present invention.

Thus as shown in FIG. 2, which is solder reflow profile, a peak temperature during which solder reflow occurs is approximately 122° C. This solder reflow process thus results in the chip joint shown in FIG. 1D in which alloy material 120 is reflowed to result in material 125. While the scope of the present invention is not limited in this regard, the time for temperature elevation to occur for solder melting may be between approximately 200 and 300 seconds. Then a peak temperature of the reflow process may occur for approximately between 30 and 90 seconds at temperatures between approximately 117° C. and 122° C. Finally, the solder reflow process is allowed to cool to form the joint. Such solder solidification process may occur for between 90 and 120 seconds.

Figure 4:
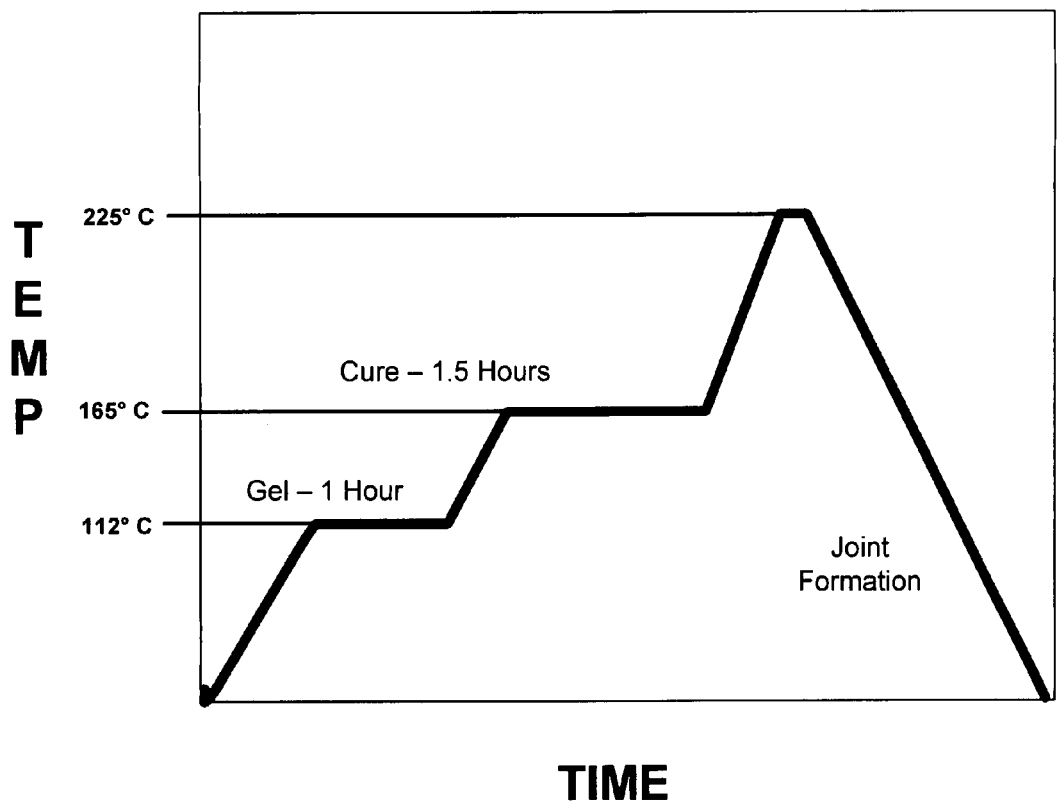
FIG. 4 is a gel, curing and solder reflow profile in accordance with one embodiment of the present invention.

Referring now to FIGS. 3A-3B, shown are cross-section views of further process steps in accordance with an embodiment of the present invention. As shown in FIG. 3A, next an underfill process may be performed in which an underfill material 150 such as an epoxy underfill may be applied, e.g., using a capillary underfill method. This underfill material may then be gelled below the melting point of the low melting point solder, e.g., at 112° C., as shown in the thermal profile of FIG. 4. As shown further in FIG. 4, after gelling, the temperature may be elevated, e.g., to 165° C. for a cure process during which package stress across the die and bumps may be redistributed. After curing, the temperature may be raised to enable joint formation, as shown in FIG. 3B in which an alloy material 160 with a new composition is realized after the high temperature reflow process which, in the embodiment of FIG. 4 may occur at approximately 225° C. As described above, the final composition of the alloy may be based on the percentage of materials within the joint. For example, in some embodiments the combined volumes of the alloy and substrate bumps may be such that results in alloy of approximate composition 87 Sn/9.2 In/3.2 Ag/0.6 Cu. Thus this resulting alloy may be realized with a high melting point and mechanical properties to enable stress-free conditions.

While shown with this particular implementation in the embodiments of FIGS. 1-4, the scope of the present invention is not limited in this regard. For example, in addition to a process such as the flip chip process described above for formation of a semiconductor package, such as a package including a semiconductor die such as a microprocessor, chipset or other such component, other embodiments may be used to form solder joints for lead-free capacitors and so forth.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
depositing an alloy material on lead-free bumps coupled to a package substrate;
placing a semiconductor die including conductive bumps on the package substrate so that the conductive bumps contact the alloy material;
elevating a temperature of the attached semiconductor die and the package substrate to a first elevated temperature to reflow the alloy material;
underfilling an epoxy material between the semiconductor die and the package substrate and allowing the epoxy material to gel at a temperature below the first elevated temperature;
curing the epoxy material at a second elevated temperature, the second elevated temperature greater than the first elevated temperature; and
elevating the semiconductor die and the package substrate to a third elevated temperature to reflow the alloy material and the lead-free bumps to form an alloy joint between the semiconductor die and the package substrate.

2. The method of claim 1, wherein the first elevated temperature is less than approximately 125° Celsius (C), the second elevated temperature is less than approximately 170° C., and the third elevated temperature is less than approximately 230° C.

3. The method of claim 2, wherein the alloy material comprises an indium tin (InSn) material and the lead-free bumps comprise tin silver copper (SnAgCu).

4. The method of claim 1, wherein the alloy joint comprises a tin (Sn) indium (In) silver (Ag) copper (Cu) material.

5. The method of claim 1, wherein the alloy material comprises indium (In) tin (Sn) having a composition of 52 In/48 Sn and the lead-free bumps comprise tin silver copper (SnAgCu), having a composition of 95.5 Sn/3.8 Ag/0.7 Cu.

6. The method of claim 1, further comprising reflowing the alloy material for less than 500 seconds.

7. The method of claim 1, further comprising reflowing the alloy material and forming the joint at the first elevated temperature; wherein the first elevated temperature is too low to reflow the package bumps.

8. A method comprising:
depositing a previously formed alloy material on lead-free solder bumps of a package substrate, the alloy material including indium tin (InSn);
coupling a semiconductor die including conductive bumps to the package substrate and contacting the conductive bumps to the alloy material;
elevating a temperature of the attached semiconductor die and the package substrate in a heating unit to a first temperature and consequently reflowing the alloy material and forming a joint between the semiconductor die and the package substrate;
underfilling an epoxy material between the semiconductor die and the package substrate and allowing the epoxy material to gel at a temperature below the first temperature;
curing the epoxy material at a second temperature, the second temperature greater than the first temperature; and
elevating the attached semiconductor die and the package substrate to a third temperature and consequently reflowing the alloy material and the solder bumps and forming an alloy joint between the semiconductor die and the package substrate.

9. The method of claim 8, wherein the lead-free solder paste comprises a tin (Sn) silver (Ag) copper (Cu) material.

10. The method of claim 9, wherein the SnAgCu material is comprised of 95.5 Sn/3.8 Ag/0.7 Cu.

11. A method comprising:
depositing a previously formed alloy material on lead-free package substrate bumps;
placing a semiconductor die, including conductive die bumps, on the package substrate and connecting the die bumps to the alloy material;
heating the alloy material and die and substrate bumps to a first temperature;
at the first temperature, reflowing the alloy material and forming a first joint between the die and substrate bumps;
heating the first joint and die and substrate bumps to a second temperature greater than the first temperature;
curing an underfill material, located between the package substrate and die, at the second temperature;
heating the cured first joint and die and substrate bumps to a third temperature greater than the second temperature; and
at the third temperature, reflowing the cured first joint and substrate bumps and forming a second joint, between the substrate and die bumps, that includes a composition of materials unequal to a composition of materials included in the first joint.

12. The method of claim 11 wherein
the substrate bumps include a tin (Sn) silver (Ag) copper (Cu) material;
the first joint includes an indium (In) Sn material; and
the second joint includes a composition based on the SnAgCu material and the In Sn material.

13. The method of claim 12 wherein
the substrate bumps include 95.5 Sn/3.8 Ag/0.7 Cu;
the first joint includes 52 In/48 Sn; and
the second joint includes 87 Sn/9.2 In/3.2 Ag/0.6 Cu.

14. The method of claim 11, wherein the first temperature is generally between 116° and 122° Celsius, the second temperature is generally less than 170° Celsius, and the third temperature is generally between 230° and 170° Celsius.

* * * * *